United States Patent [19]

Lord

[11] Patent Number: 5,440,280
[45] Date of Patent: Aug. 8, 1995

[54] DIGITAL MICROWAVE MULTI-BIT ATTENUATOR

[75] Inventor: J. L. Martin Lord, North Vancouver, Canada

[73] Assignee: MPR Teltech Ltd., Canada

[21] Appl. No.: 122,361

[22] Filed: Sep. 17, 1993

[51] Int. Cl.⁶ .............................................. H01P 1/22
[52] U.S. Cl. .................... 333/81 R; 327/308
[58] Field of Search ................. 333/81 A, 81 R; 307/540, 542, 568

[56] References Cited

U.S. PATENT DOCUMENTS

| | | | |
|---|---|---|---|
| 3,529,266 | 9/1970 | King | 333/81 A |
| 3,684,974 | 8/1972 | Solomon et al. | 330/30 D |
| 4,975,604 | 12/1990 | Barta | 333/81 R |
| 4,978,932 | 12/1990 | Gupta et al. | 333/81 A |
| 5,157,323 | 10/1992 | Ali et al. | 333/81 R |
| 5,281,928 | 1/1994 | Ravid et al. | 333/81 R |

FOREIGN PATENT DOCUMENTS

| | | | |
|---|---|---|---|
| 1302272 | 1/1973 | European Pat. Off. | 333/81 R |
| 0148706 | 7/1985 | European Pat. Off. | 333/81 R |
| 0127658 | 10/1979 | Japan | 333/81 R |
| 1626276 | 2/1991 | U.S.S.R. | 333/81 R |

OTHER PUBLICATIONS

"DC-20 GHz MMIC Multi-Bit Digital Attenuators With On Chip TTL Control", B. Khabbaz, A. Pospishil, E. R. Schineller, H. P. Singh, Jon Jorgenson, 1991 IEEE, GaAs Symposium, pp. 239-242.

"Low-Loss, High-Power, Broadband GaAs MMIC Multi-Bit Digital Attenuators With On-Chip TTL Drivers", Fazal Ali, Scott Mitchell & Allen Podell; 1991 IEEE, GaAs Symposium, pp. 243-246.

"An Ultra Broadband DC-12 GHz 4-Bit GaAs Monolithic Digial Attenuator", Finbarr J. McGrath & Russ G. Pratt, 1991 IEEE, GaAs IC Symposium, pp. 247-250.

*Primary Examiner*—Robert J. Pascal
*Assistant Examiner*—Darius Gambino
*Attorney, Agent, or Firm*—Myers, Liniak & Berenato

[57] ABSTRACT

An attenuator circuit having a resistive "T" network and a resistive "Pi network in parallel with said "T" network.

8 Claims, 4 Drawing Sheets

Fig. 4

TRUTH TABLE - Modified Bridge-Tee (4 bit attenuator)

| STATE | Q1 | Q2 | Q3 | Q4 | Q5 | Q6 | Q7 | Q8 | Q9 | Q10 | Q11 | Q12 | Q13 | Q14 | Q15 |
|---|---|---|---|---|---|---|---|---|---|---|---|---|---|---|---|
| 1  | O | O | O | O | O | ● | ● | ● | ● | ● | ● | O | O | O | O |
| 2  | ● | O | O | O | O | ● | ● | ● | ● | ● | ● | ● | O | O | O |
| 3  | ● | O | O | O | O | ● | ● | ● | O | O | ● | ● | O | O | O |
| 4  | ● | O | O | O | O | ● | O | ● | O | O | ● | O | ● | O | ● |
| 5  | ● | O | O | O | O | O | ● | ● | O | O | ● | O | ● | ● | O |
| 6  | ● | ● | O | O | O | ● | ● | ● | ● | O | ● | O | ● | ● | O |
| 7  | ● | ● | O | O | O | O | O | O | O | ● | O | ● | ● | O | ● |
| 8  | O | ● | O | O | O | ● | ● | O | ● | ● | O | O | ● | ● | O |
| 9  | ● | O | ● | ● | O | O | ● | O | O | ● | O | O | ● | ● | O |
| 10 | ● | ● | ● | ● | O | ● | ● | O | O | ● | O | O | ● | ● | ● |
| 11 | ● | O | ● | ● | O | O | ● | O | O | ● | O | O | ● | O | O |
| 12 | ● | ● | ● | O | ● | O | ● | O | ● | O | O | O | ● | ● | ● |
| 13 | O | ● | ● | ● | O | ● | O | O | ● | O | O | O | ● | O | ● |
| 14 | O | ● | ● | ● | O | ● | O | O | ● | O | O | O | ● | O | O |
| 15 | O | O | ● | O | ● | ● | O | O | ● | O | O | O | ● | ● | ● |
| 16 | O | O | ● | ● | ● | ● | O | O | ● | O | O | ● | ● | ● | ● |

O FET OFF
● FET ON

DIGITAL MICROWAVE MULTI-BIT ATTENUATOR

BACKGROUND

The present invention relates to a wideband digital microwave attenuator having a low insertion loss and suitable for monolithic implementation.

In many microwave systems attenuators are required for automatic gain control of receiver and transmitter systems. Attenuators are also used for amplitude weighting in phased array radar and for temperature compensation of microwave amplifiers. Conventional approaches to designing such attenuators use either cascaded switchable attenuators with a "Pi" or "T" resistive network and single pole, double throw switches or segmented dual gate MESFET active attenuators. For a multi-bit design, cascaded attenuators exhibit high insertion loss while dual gate MESFET attenuators have limited bandwidth and are limited in their RF power handling capabilities.

In an article in the 1991 IEEE GaAs IC Symposium entitled "Low-Loss, High Power, Broadband GaAs MMIC Multi-Bit Digital Attenuators with On-Chip TTL Drivers" by Fazal Ali et al. of Pacific Monolithics there is disclosed a multi-bit GaAs MMIC digital attenuator utilizing a modified "Double Pi" network with a single composite structure rather than cascaded bits. By employing "T", "Pi" and "Double-Pi" structures, adjustment of the various resistor values is achieved using switched FETS. In the same IEEE publication as above at page 247 in an article entitled "An Ultra Broadband DC-12 GHz 4-Bit GaAs Monolithic Digital Attenuator" by Finbarr J. McGrath, et al. there is disclosed a 4-bit digital attenuator with purportedly low insertion loss and operation to 12 GHz. However, the circuit includes 8 cascaded series resistors. In either type of circuit the size of the FETS used must be large to realize a low loss, but small to extend the bandwidth, especially as the level of attenuation is increased. Cascaded stages translate into a larger chip size and more interstage interactions to account for.

Analog-type attenuators typically use the same topologies as the digital types but do not necessarily require the cascading of stages to obtain both resolution and dynamic range. However, analog-type attenuators have an electrode control voltage transfer function that is non-linear. Since most control electronics use digital logic, a digital to analog transformation must be performed to approximate the transfer curve. Analog attenuators are also more sensitive to temperature variations than digital ones.

Accordingly, it is an object of the invention to provide an improved digital multi-bit attenuator.

SUMMARY OF THE INVENTION

According to the invention there is provided a multi-bit attenuator having a paralleled "T" and "Pi" section.

The invention drastically reduces chip area required for a wideband monolithic implementation while, at the same time, providing low insertion loss. By allowing integration of both RF and digital circuitry on the same chip, complexity of the control electronics is reduced. Low insertion loss, precision and wide bandwidth result from the use of only two cascaded stages instead of the five used for a 5-bit typical digital approach.

The paralleled "T" and "Pi" topology (hereinafter called "T/Pi") combined with the branch networks allow a 4-bit realization that is wideband and low loss. The low pass/high pass characteristics of "T/Pi" parallel with the small FET gate peripheries help maintain the dynamic range over a wide bandwidth. The 4bit topology uses the minimum number of switches necessary to obtain all of the 15 attenuation states with a very good resolution step accuracy between each state. Any multi-bit realization can thus make use of the 4-bit circuit as a building block. For instance, the 5-bit structure shown later uses two cascaded "T/Pi's", namely the 4-bit and the 5th bit, and has advantageous performance compared to typical 5-bit digital attenuators, in terms of precision, dynamic range, and insertion loss.

The "control" resistors, that interconnect the control signals to the control electrodes of the switching elements, can be determined so as to equalize the switch rise and fall times between all states. The small FET sizes allow larger resistors to be used. For a given switching delay requirement, such large resistors improve the video feed-through performance of the attenuator.

BRIEF DESCRIPTION OF THE DRAWINGS

The novel features believed characteristic of the invention are set forth in the appended claims. The invention itself, as well as other features and advantages thereof, will be best understood by reference to the description which follows read in conjunction with the accompanying drawings, wherein:

FIG. 4 is a truth table for the 4-bit attenuator of FIG. 3.

DETAILED DESCRIPTION WITH REFERENCE TO THE DRAWINGS

Figure 1:
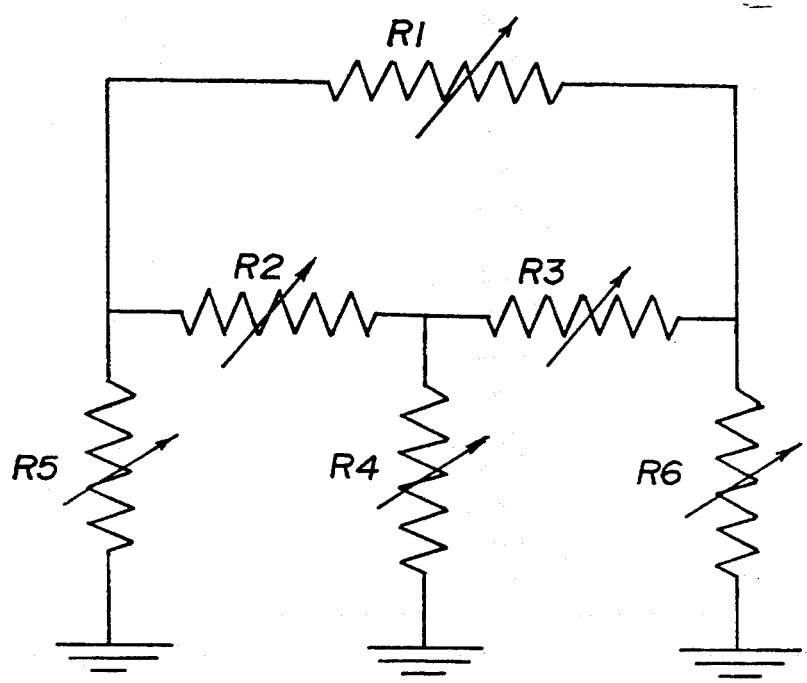
FIG. 1 is a circuit diagram of the basic topology of a preferred embodiment of the invention.

Referring to FIG. 1, there is shown the basic hybrid topology composed of a "Pi" and a "T" section of resistors in parallel. The "Pi" section consists of resistors R1, R5 and R6 while the "T" section consists of resistors R2, R3, and R4. By providing for a mechanism of varying the resistance values of the resistors, varying amounts of attenuation of an input signal are produced. Moreover, 6 degrees of freedom are provided with only one network.

Figure 2:
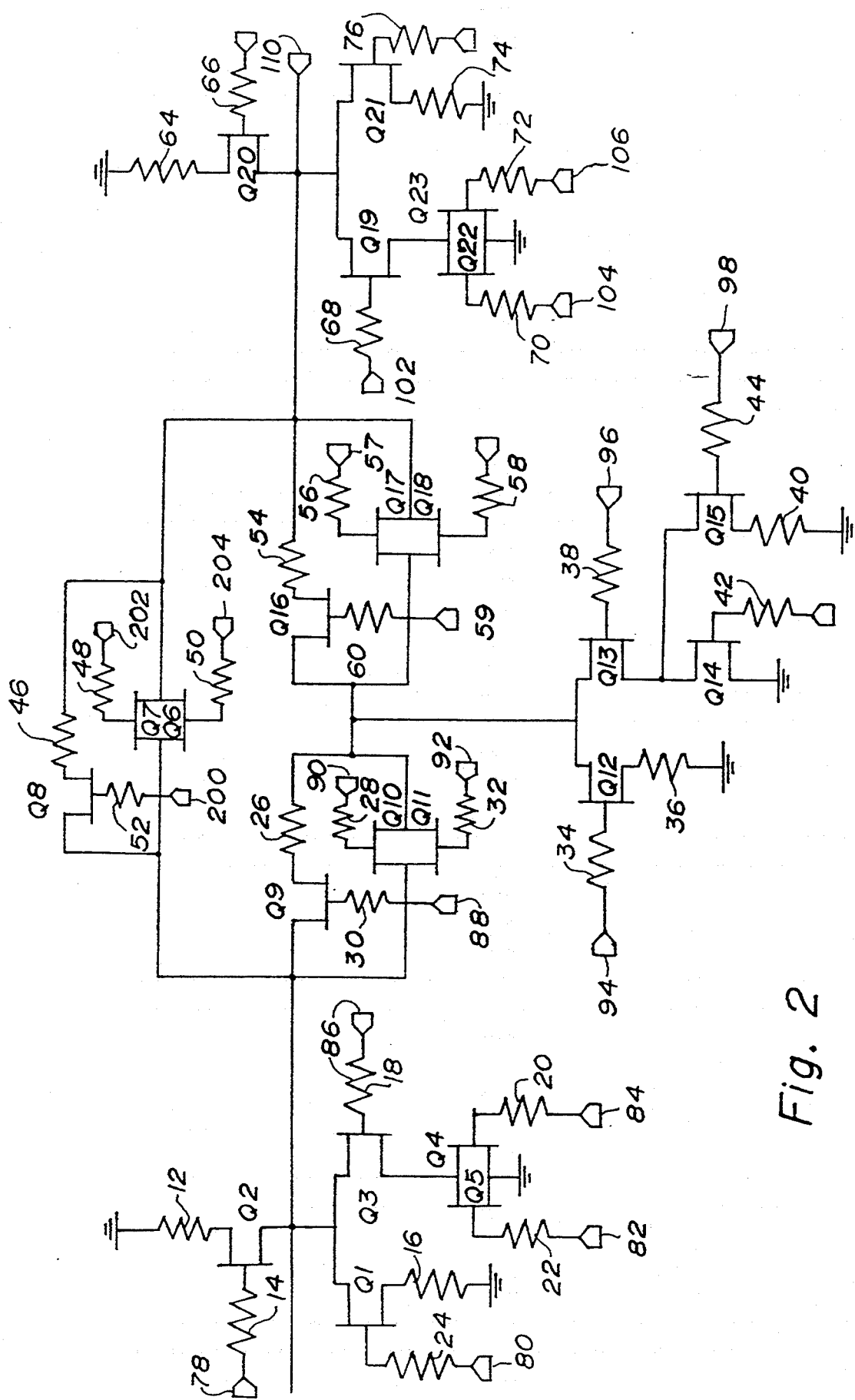
FIG. 2 is a circuit diagram of a 4-bit attenuator which uses transistors as switches.

Referring to FIG. 2, there is shown a 4-bit attenuator consisting of resistors and FET's connected together in the basic configuration of FIG. 1. Resistor R5 of FIG. 1 corresponds to resistors 12 and 16 and channel resistances of transistors Q1 to QS, inclusive, of FIG. 2. Resistor R1 corresponds to resistor 46 and the channel resistances of transistors Q6 to Q8, inclusive. Resistor R2 of FIG. 1 corresponds to resistor 26 and the channel resistances of transistors Q9 to Q11, inclusive, of FIG. 2. Resistor R4 corresponds to resistors 36 and 40 and the channel resistances of transistors Q12 to Q15, inclusive. Resistor R3 corresponds to resistor 54 and the channel resistances of transistors Q16 to Q18, inclusive, and resistor R6 corresponds to resistors 64 and 74 and the channel resistances of transistors Q19 to Q23, inclusive. Table I below lists the control signals, the gate resistors through which they are applied and the transistors to which they are applied:

TABLE I

| CONTROL SIGNAL | RESISTOR | TRANSISTOR |
|---|---|---|
| 78 | 14 | Q2 |
| 80 | 24 | Q1 |
| 82 | 22 | Q5 |
| 84 | 20 | Q4 |
| 86 | 18 | Q3 |
| 200 | 52 | Q8 |
| 202 | 48 | Q7 |
| 204 | 50 | Q6 |
| 88 | 30 | Q9 |
| 90 | 28 | Q10 |
| 92 | 32 | Q11 |
| 94 | 34 | Q12 |
| 96 | 38 | Q13 |
| 98 | 44 | Q15 |
| 100 | 42 | Q14 |
| 57 | 56 | Q17 |
| 59 | 60 | Q16 |
| 61 | 58 | Q18 |
| 102 | 68 | Q19 |
| 104 | 70 | Q22 |
| 106 | 72 | Q23 |
| 110 | 66 | Q20 |
| 112 | 76 | Q21 |

Figure 3:
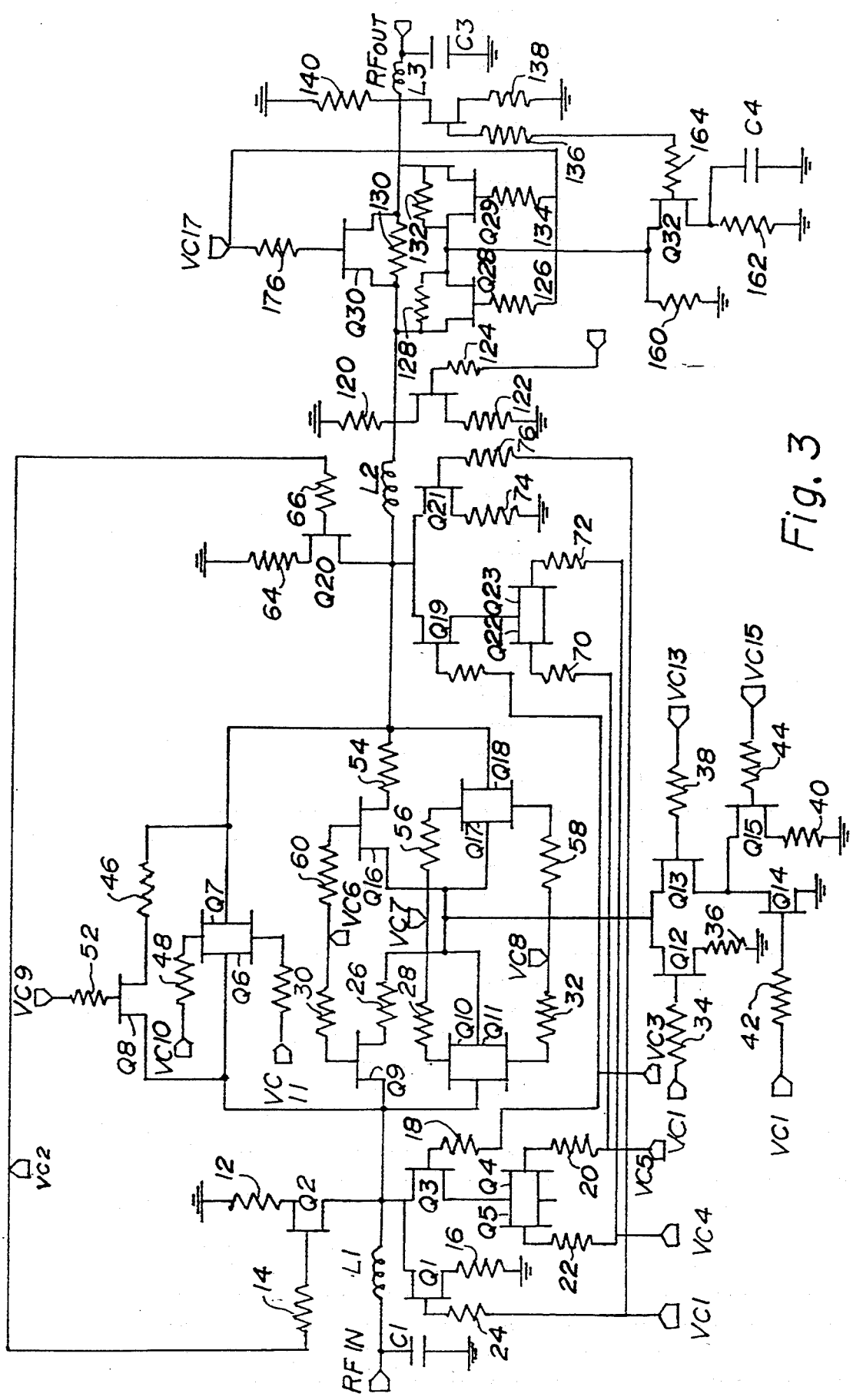
FIG. 3 is a circuit diagram of a 5-bit attenuator made up of a cascaded 4-bit attenuator and a 1-bit attenuator showing the resistance values and dimensions of the FETS.

Allowing for FET "ON" resistances whose values are proportional to their gate peripheries, the number of different values of R5's possible with the number of control transistors Q1 to Q5, inclusive, in this configuration is 16. The number of different values of each of R1, R2, R3 and R4 is 8. The requirement of obtaining good resolution step accuracy and VSWR over all 16 attenuation states determines the "ON" channel resistance values of the various transistors and their state for each attenuation level. By employing symmetry in the values of the resistors R2 and R3 and R5 and R6, the number of control lines for the 23 transistors can be reduced to 15. FIG. 3 shows the circuit of FIG. 2 with the control signal lines combined, with values assigned to the resistors, with the dimensions of the transistors in microns and with a cascaded 1-bit circuit. The 1-bit structure is used to switch in the largest attenuation step, i.e., 16 decibels in the case of a 5-bit 1 decibel step attenuator. The inductors L1, L2 and L3 and capacitors to ground C1, C2, and C3 provide better VSWR by combining capacitive parasitics into a low pass, lumped equivalent of a transmission line. Aside from combining control signal lines from symmetrical equivalent transistors, the 4-bit portion of FIG. 3 is identical to FIG. 2. The 1-bit portion consists of resistors 120, 122, 128, 130, 132, 138, 140, 160 and 162. Resistor 122 is switched into the circuit by transistor Q24 when the latter is switched on by control signal VC16 applied through resistor 124 to the gate of Q24. The same control signal VC16 is also applied to transistors Q31 and Q32 through resistors 136 and 164, respectively. Control signal VC17 is applied through resistors 176, 134 and 126 to transistors Q30, Q29, and Q28, respectively.

In the 1-bit attenuator circuit of FIG. 3, resistors 120 and 122 and channel resistance of Q24 correspond to R5 of FIG. 1, resistor 130 and the channel resistance of transistor Q30 to R1, resistor 128 and the channel resistance of transistor Q28 to R2, resistor 132 and the channel resistance of transistor Q29 to R3, and resistors 140 and 138 and the channel resistance of transistor Q31 to R6, and finally resistors 160 and 162 and the channel resistance of transistor Q32 to R4. Capacitor C4 compensates for frequency response degradation which is especially critical when larger attenuation levels are required.

The circuits of FIGS. 1 to 3 are ideally suited for monolithic integration. They are capable of being formed into a relatively small size with loss characteristics comparable to more traditional approaches.

FIG. 4 is a truth table showing the state of each transistor in the 4-bit attenuator portion for each of the 16 states. State 1 corresponds to the "ground" resistances being a maximum and the series resistances a minimum. State 16 corresponds to low ground resistances and high series resistances.

For the 1-bit attenuator, the truth table showing the state of each FET is shown below:

| STATE | Q24 | Q30 | Q28 | Q32 | Q29 | Q31 |
|---|---|---|---|---|---|---|
| 1 | off | on | on | off | on | off |
| 2 | on | off | off | on | off | on |

Although values of resistors, interconnections and gate peripheries of transistors have been made which result in symmetry, obviously other choices are possible.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modification or embodiments as fall within the true scope of the invention.

We claim:

1. A wideband digital microwave attenuator circuit formed on a semiconductor substrate, comprising:
    (a) a resistive "T" network having a signal input terminal and a signal output terminal; and
    (b) a resistive "Pi" network having a signal input terminal and signal output terminal such that only the signal input and signal output terminals of said "T" network are connected to the signal input and signal output terminals, respectively, of said "Pi" network, whereby to place said resistive "Pi" network in parallel with said resistive "T" network.

2. A circuit according to claim 1, wherein said "T" and "Pi" networks each have switching elements and switching means for changing the resistive state of at least some of said elements.

3. A circuit according to claim 1, wherein said "T" and "Pi" networks each have a plurality of branches and switching elements in each of said branches, control signal lines coupled to each of said switching elements for conducting control signals to cause reversible switching of said elements from an "ON" to an "OFF" condition, the switching of said elements operative to adjust the resistance in each branch of said "Pi" and "T" networks and thereby change the attenuation level of said circuit.

4. A circuit according to claim 3, wherein each of said branches of said "Pi" and "T" networks has multiple resistance paths and including switching elements in said paths to reversibly switch the resistance of the paths from a high impedance to a lower impedance value.

5. A circuit according to claim 4, wherein said switching elements are FETS.

6. A circuit according to claim 4, wherein each of said branches has at least two paths.

7. A circuit according to claim 4, including a 4-bit parallel "Pi" and "T" network cascaded with a 1-bit "Pi" and "T" network.

8. A circuit according to claim 1, including a digital multiplexer and encoder interfacing a parallel bit stream source of signals with said circuit.

* * * * *